United States Patent [19]

Sago et al.

[11] Patent Number: 5,439,519
[45] Date of Patent: Aug. 8, 1995

[54] SOLUTION APPLYING APPARATUS

[75] Inventors: Hiroyoshi Sago; Hirotsugu Kumazawa; Futoshi Shimai; Shigemi Fujiyama; Hiroki Endo; Hideya Kobari, all of Kanagawa, Japan

[73] Assignee: Tokyo Ohka Kogyo Co., Ltd., Kanagawa, Japan

[21] Appl. No.: 176,204

[22] Filed: Jan. 3, 1994

Related U.S. Application Data

[63] Continuation-in-part of Ser. No. 994,364, Dec. 21, 1992.

[30] Foreign Application Priority Data

Apr. 28, 1992 [JP] Japan .................................. 4-136125
Jun. 30, 1993 [JP] Japan .................................. 5-162901

[51] Int. Cl.[6] .......................... B05C 11/02; B05C 5/00
[52] U.S. Cl. .......................................... 118/52; 118/501
[58] Field of Search ........................... 118/52, 500, 501

[56] References Cited

U.S. PATENT DOCUMENTS

| | | | |
|---|---|---|---|
| 3,730,134 | 5/1973 | Kadi | 118/52 X |
| 4,157,931 | 6/1979 | Bricot | 156/230 |
| 4,201,149 | 5/1980 | Koester et al. | 118/52 |
| 4,519,846 | 5/1985 | Aigo | 134/15 |
| 4,640,846 | 2/1987 | Kuo | 118/52 X |
| 4,889,069 | 12/1989 | Kawakami | 118/52 X |
| 5,009,185 | 4/1991 | Stokes et al. | 118/52 |
| 5,234,499 | 8/1993 | Sasaki et al. | 118/52 |

FOREIGN PATENT DOCUMENTS 4146615 5/1992 Japan .................... H01L 21/027

*Primary Examiner*—Michael W. Ball
*Assistant Examiner*—Francis J. Lorin
*Attorney, Agent, or Firm*—Weiner, Carrier & Burt; Joseph P. Carrier; Irving M. Weiner

[57] ABSTRACT

A solution applying apparatus has inner and outer cups each having an upper opening, the inner cup being rotatably disposed in the outer cup. The inner cup houses a planar workpiece such as a glass substrate therein which is to be coated with a coating solution such as a resist solution. The solution applying apparatus also has a lid assembly having an outer cup lid for closing the upper opening of the outer cup and an inner cup lid for closing the upper opening of the inner cup, the inner cup lid being rotatable with respect to the outer cup lid. The inner cup has drain holes defined in an outer circumferential portion thereof for providing communication between a space within the inner cup and a space outside of the inner cup to drain an excessive coating solution from the inner cup. The outer cup has an annular collection passage defined therein along the outer circumferential portion of the inner cup, the drain holes opening into the annular collection passage. The lid assembly includes a self-centering valve body that can be vertically movable into and out of snugly fitting relation to a through hole defined in the inner cup lid and a lost motion mechanism for moving the valve body to an open position thereof while the first and second cup lids remain closed and for opening the outer cup lid while the inner cup lid remains closed. After the workpiece has been coated with the coating solution, the valve body is lifted out of the through hole to smoothly eliminate a vacuum developed in the inner cup, and then the inner cup is opened.

23 Claims, 10 Drawing Sheets

SOLUTION APPLYING APPARATUS

This application is a continuation-in-part of U.S. Pat. Ser. No. 07/994,364 filed Dec. 21, 1992.

BACKGROUND OF THE INVENTION

Field of the Invention

The present invention relates to an apparatus for applying a resist solution or the like to a surface of a planar workpiece such as a glass substrate for use in a liquid-crystal display panel or a semiconductor wafer, and more particularly to such a solution applying apparatus having a rotatable cup for holding a planar workpiece therein.

Description of the Relevant

Semiconductor devices such as thin-film transistors (TFT) or metal-insulator-metal (MIM) semiconductors are fabricated on a glass substrate according to a fabrication process that includes the step of applying a resist solution to the glass substrate. One known apparatus for applying a resist solution has a rotatable cup for holding a workpiece therein as disclosed in Japanese laid-open patent publication No. 4-146615.

The disclosed solution applying apparatus comprises a cup rotatable by a spinner and a chuck disposed in the cup. A wafer is fixedly supported on the chuck, and a solution such as a resist solution to be coated on the wafer is dropped onto the upper surface of the wafer, after which the upper open end of the cup is closed by a lid, covering the entire exposed upper surface of the wafer in the cup. Then, the chuck and the wafer are rotated together to cause the solution dropped on the upper surface of the wafer to spread uniformly thereover.

The cup has holes defined in a circumferential side wall thereof. When the cup is rotated, it is evacuated under centrifugal forces to remove a gas dissolved in the solution and any excessive solution through the holes. If the lid were opened immediately after the solution has been applied to the wafer, exposing the wafer to ambient air in its entirety, dust particles floating around the cup would flow into the cup and be attached to the wafer.

To prevent dust particles from being attached to the wafer, the lid has a vent hole which is closed by a rod-shaped valve body while the solution is being coated on the wafer upon rotation of the cup. After the solution has been coated on the wafer, the valve body is actuated to open the vent hole, allowing air to flow into the cup from a peripheral edge of the lid. Since the lid is opened after the pressure in the cup has been increased by the entry of air through the vent hole opened by the valve body, dust particles are prevented to a certain extent from being introduced into the cup.

The valve body which is of a simple rod shape cannot smoothly be opened and closed due to large frictional forces, and requires a seal such as a packing in order to be reliably sealed. If the packing is disposed in the vent hole, dust particles produced by the packing tend to be introduced and attached to the wafer.

Any excessive solution that has not been coated on the wafer may not necessarily be discharged from the cup, but may remain in the cup. The excessive solution that has remained in the cup is dried into solid fragments, which may be deposited on the wafer or in the cup.

SUMMARY OF THE INVENTION

It is therefore an object of the present invention to provide a solution applying apparatus, which after a solution has been coated on a workpiece, can smoothly increase the pressure in an evacuated rotatable cup while preventing foreign matter such as dust particles from entering the cup, and thereafter open the cup for removal of the coated workpiece.

According to the present invention, there is provided a solution applying apparatus comprising an outer cup having an upper opening, a rotatable inner cup disposed in the outer cup and having an upper opening, for housing a planar workpiece therein which is to be coated with a coating solution, and a lid assembly having an outer cup lid for closing the upper opening of the outer cup and an inner cup lid for closing the upper opening of the inner cup, the inner cup lid being rotatable with respect to the outer cup lid, the inner cup having draining means in an outer circumferential portion thereof for providing communication between a space within the inner cup and a space outside of the inner cup to drain an excessive coating solution from the inner cup, the outer cup having an annular collection passage defined therein along the outer circumferential portion of the inner cup, the draining means being exposed to the annular collection passage.

The lid assembly further comprises a block movable upwardly a first distance from a position in which the outer cup and the inner cup are closed by the lid assembly, into engagement with the outer cup lid. The solution applying apparatus also has lifting/lowering means for moving the block upwardly. The inner cup lid has a boss projecting upwardly from a central portion thereof and having a female conical hole. The outer cup lid has a bearing region slidably and rotatably fittable over the boss with a first gap defined therebetween, the bearing region being engageable with the boss upon upward movement by a second distance. The block has a valve body extending downwardly therefrom and rockably supported thereon, the valve body having a male conical portion sealingly fittable in the female conical hole.

When the planar workpiece is to be coated with a solution, the outer cup lid and the inner cup lid are lowered to close the upper openings of the outer and inner cups, respectively, by the lifting/lowering means through the block, and the valve body is lowered into the female conical hole to allow the male conical portion to be self-centered and fitted snugly in the female conical hole thereby closing the female conical hole.

After the planar workpiece has been coated with the solution, the block is moved upwardly within the first distance while the outer and inner cups remain closed by the outer and inner cup lids, respectively, to lift the male conical portion out of the female conical hole for thereby allowing ambient air to enter the inner cup through the first gap, thereafter the block is moved upwardly beyond the first distance to a second distance to lift the outer cup lid off the outer cup, opening the upper opening of the outer cup, and then the block is moved upwardly beyond the second distance to lift the inner cup lid off the inner cup, opening the upper opening of the inner cup.

The above and further objects, details and advantages of the present invention will become apparent from the following detailed description of preferred embodi-

DETAILED DESCRIPTION OF THE PREFERRED EMBODIMENTS

Figure 2:
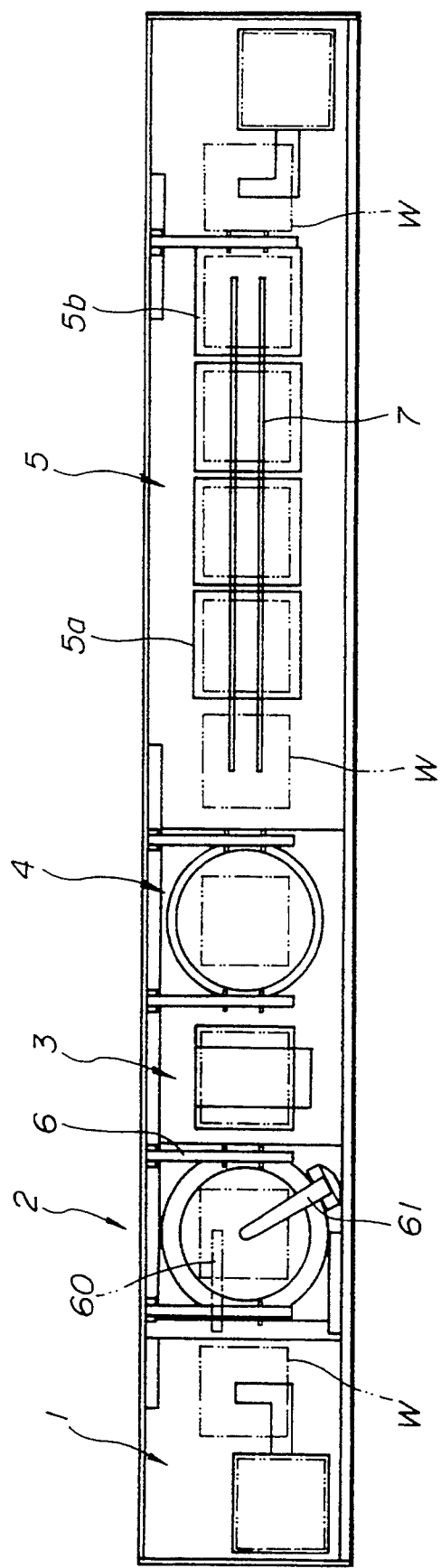
FIG. 2 is a plan view of a film forming process line which incorporates the solution applying apparatus shown in FIG. 1.

As shown in FIG. 2, a film forming process line which incorporates a solution applying apparatus according to a first embodiment of the present invention includes a charging station 1 at its upstream end (left-hand end) for supplying a rectangular plate-like workpiece W such as a glass substrate, a solution applying apparatus 2 positioned downstream of the charging station 1, an evacuating and drying device 3 positioned downstream of the solution applying apparatus 2, a cleaning device 4 positioned downstream of the evacuating and drying device 3 for cleaning the reverse side, i.e., the lower surface, of the glass substrate W, and a heating station 5 positioned downstream of the cleaning device 4 and having a succession of hot plates 5a and a cooling plate 5b. The glass substrate W is fed from the charging station 1 successively through the solution applying apparatus 2, the evacuating and drying device 3, and the cleaning device 4 to the heating station 5 by a feeding device 6 while the lower surfaces of front and rear ends of the glass substrate W are being supported by the feeding device 6. In the heating station 5, the glass substrate W is transferred successively over the hot plates 5a while the lower surface of the glass substrate W is being supported by a feeding device 7 which makes cranking movement in a vertical plane, and is finally fed over the cooling plate 5b which adjusts the temperature of the glass substrate W.

Figure 1:
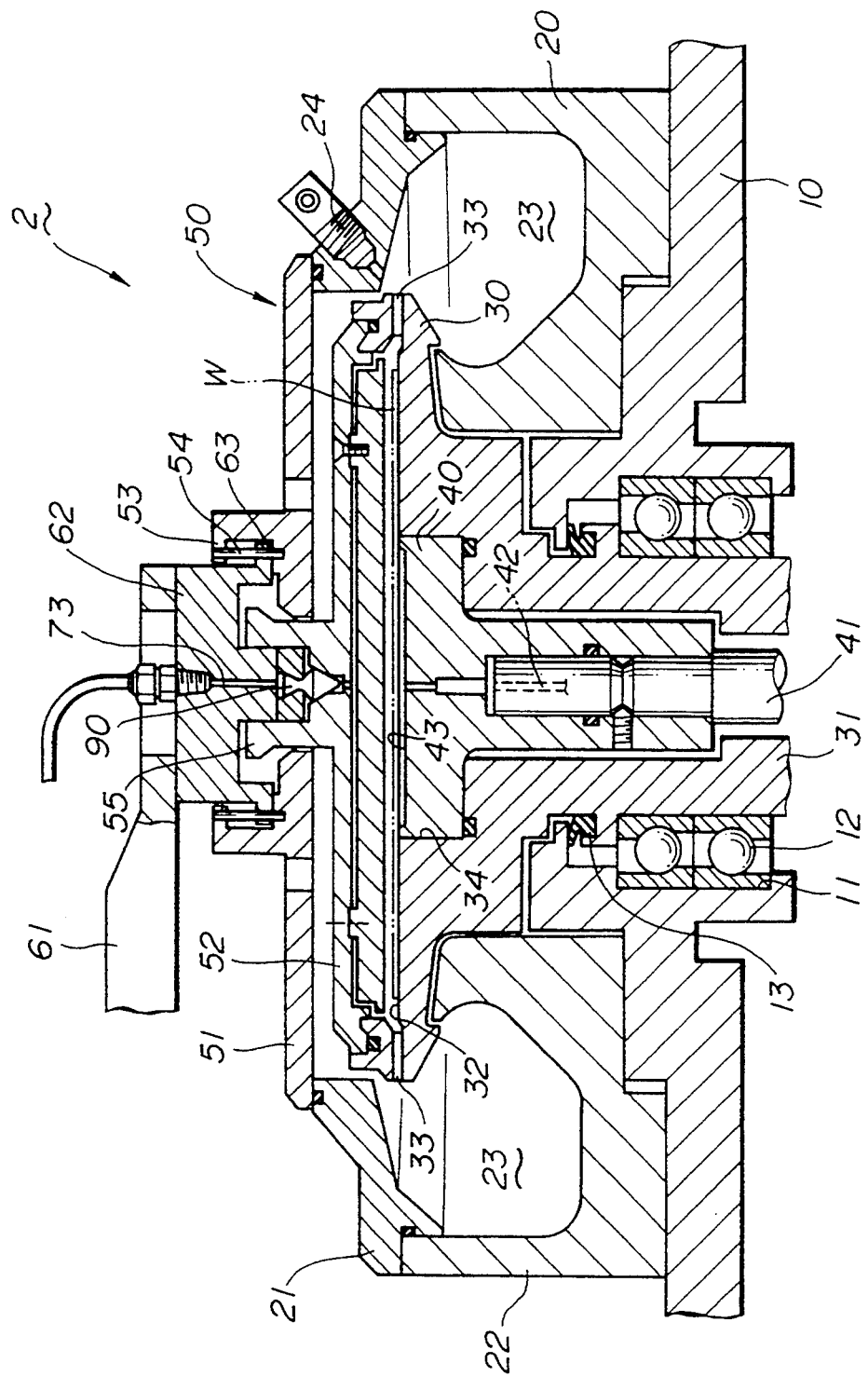
FIG. 1 is a vertical cross-sectional view of a solution applying apparatus having a rotatable cup according to a first embodiment of the present invention, with a lid closed over the rotatable cup.

As shown in FIG. 1, the solution applying apparatus 2 according to the present invention comprises a base 10, an annular outer cup 20 fixedly mounted on the base 10, an inner cup 30 disposed in the outer cup 20, a chuck 40 housed in the inner cup 30, and a lid assembly 50 positioned upwardly of the outer cup 20 and the inner cup 30.

The outer cup 20 comprises an upper member 21 and a lower member 22 disposed on the base 10, the upper member 21 being mounted on the lower member 22. The outer cup 20 has an annular collection passage or chamber 23 defined between the upper and lower members 21, 22 for collecting a coating solution and a cleaning solution or the like therein. The inner cup 30 has an outer circumferential wall exposed in the annular collection passage 23. The inner cup 30 has a plurality of communication holes 33 defined radially in the outer circumferential wall thereof, the communication holes 33 serving as a draining means for draining the coating and cleaning solutions and also air. A plurality of nozzles 24, serving as a cleaning means for ejecting the cleaning solution toward the communication holes 33, are mounted at angularly spaced intervals on the upper member 21. The nozzles 24 eject a solvent of the coating solution or the cleaning solution to prevent any excessive coating solution discharged through the communication holes 33 from being solidified.

Figure 8:
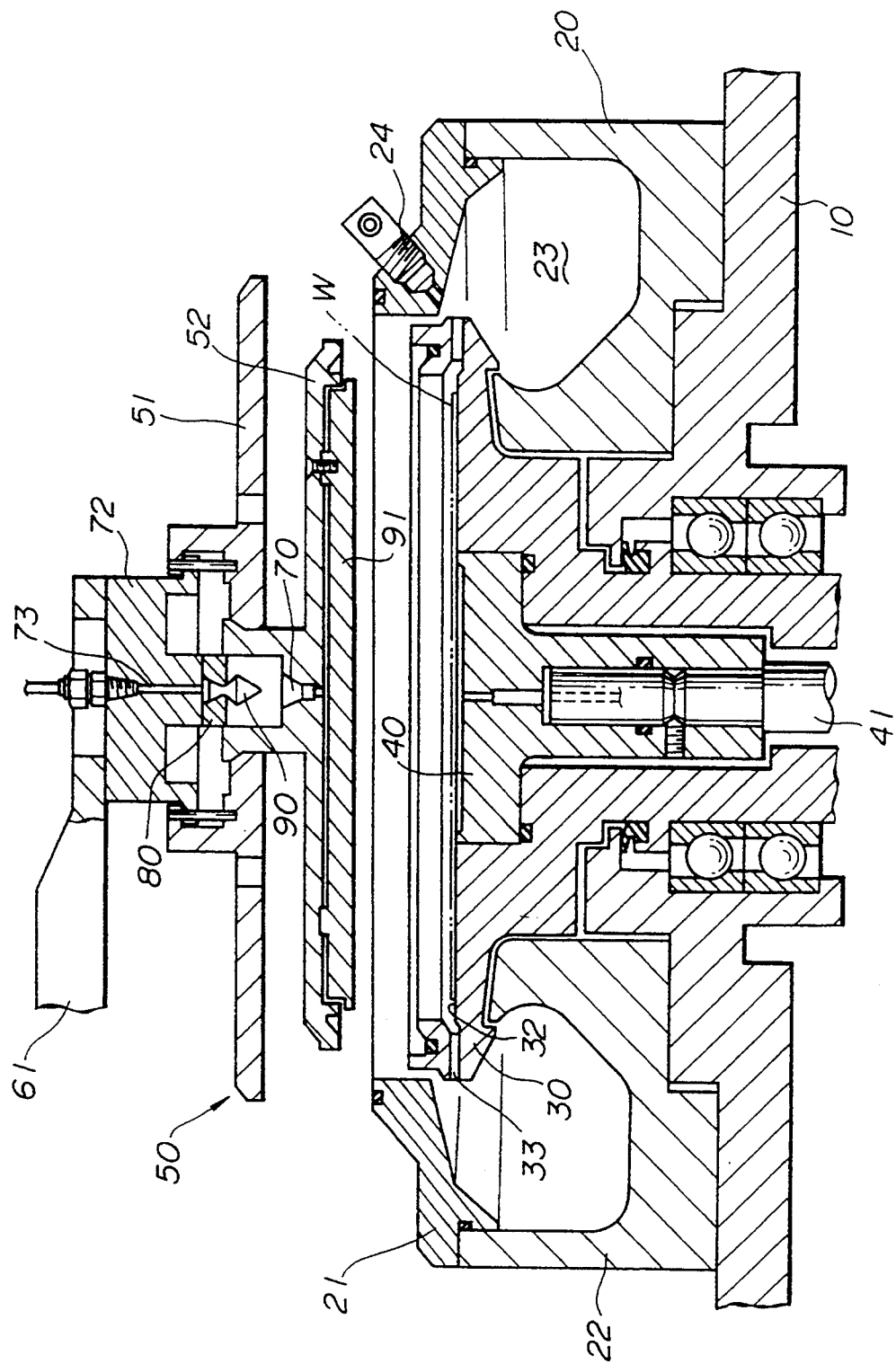
FIG. 8 is a vertical cross-sectional view of the solution applying apparatus shown in FIG. 1, with the lid open.

The inner cup 30 has a vertical hollow central shaft 31 rotatably supported in an opening 11 in the base 10 by a bearing 12. A seal ring 13 which provides a hermetic seal between the base 10 and the inner cup 30 is positioned above the bearing 12. As shown in FIGS. 1 and 8, the inner cup 30 also has an upwardly open recess 32 defined in an upper surface thereof. The recess 32 and the collection passage 23 are held in communication with each other by the communication holes 33. The inner cup 30 further has an opening 34 defined centrally therein which accommodates the chuck 40 therein, the opening 34 opening upwardly at the bottom of the recess 32.

A spinner includes a motor (not shown) having a rotatable shaft 41 which is inserted upwardly into the chuck 40 and has an axial suction hole 42 defined therein that is connected to a vacuum pump or any other vacuum source. The suction hole 42 has an upper end connected to a suction groove 43 that is defined in the upper surface of the chuck 40. When a vacuum is developed in the suction groove 43 through the suction hole 42 by the vacuum pump, the glass substrate W placed on the chuck 40 is attracted to and stably held on the chuck 40. The chuck 40, which is vertically movable with respect to the inner cup 30, is shown as being held in its lowermost position in FIG. 1 in which the chuck 40 engages the inner cup 30 through a clutch (not shown). When the rotatable shaft 41 is rotated by the motor with the chuck 40 in the lowermost position, therefore, the chuck 40 and the inner cup 30 are rotated in unison with each other.

As shown in FIGS. 1 and 2, arms 60, 61 are disposed above the outer cup 20 and the inner cup 30. The arms 60, 61 are capable of moving linearly, angularly, and vertically, or making a combination of such movements without interfering with each other. The arm 60 supports a nozzle for dropping a coating solution such as a resist solution. The arm 61 supports the lid assembly 50 on its distal end. The arm 61 serves as a lifting/lowering means for lifting and lowering the lid assembly 50 with respect to the outer cup 20 and the inner cup 30.

Figure 3:
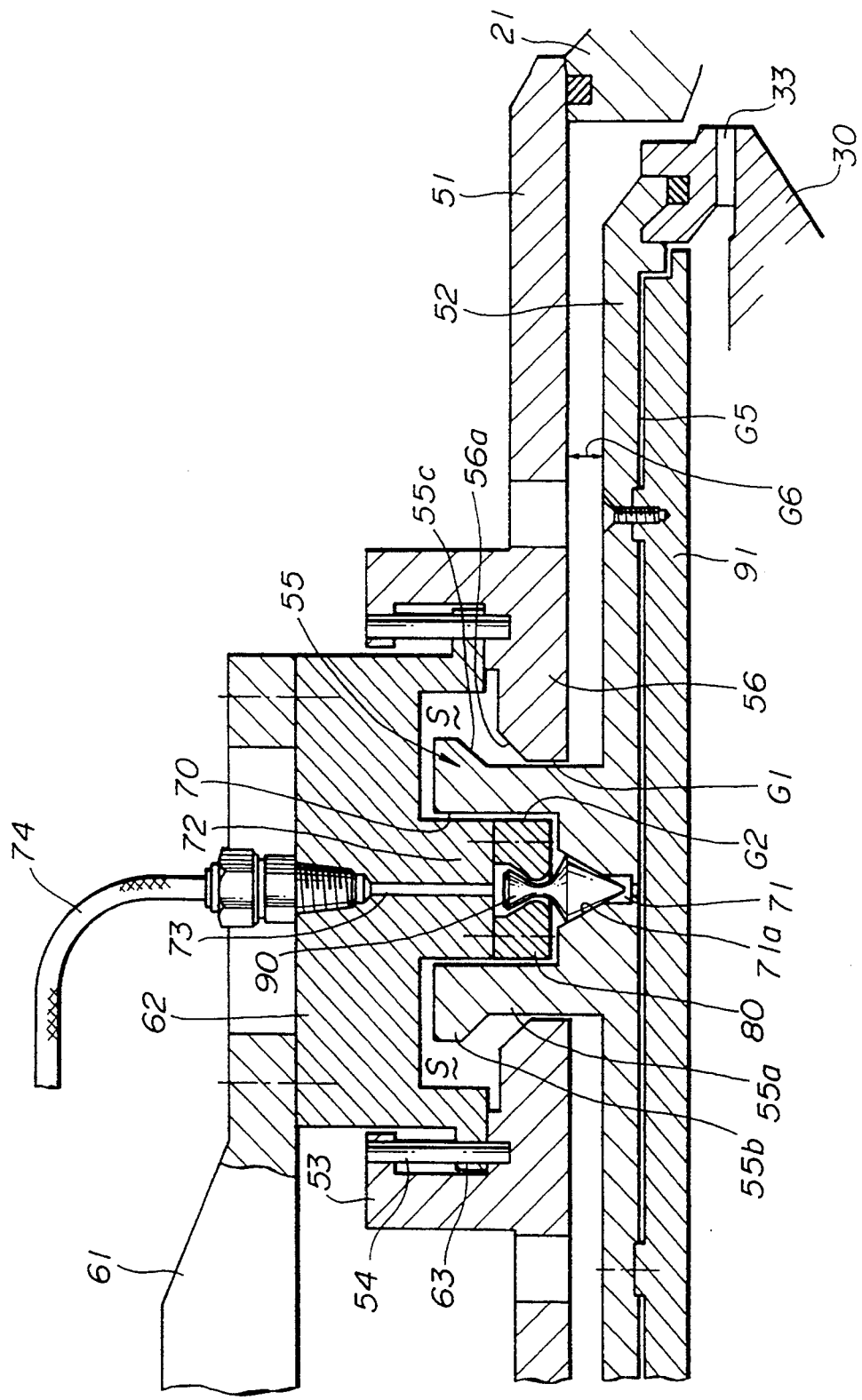
FIG. 3 is an enlarged fragmentary cross-sectional view of the solution applying apparatus shown in FIG. 1.

The lid assembly 50 comprises an outer cup lid 51 and an inner cup lid 52. As illustrated in FIG. 3, the lid assembly 50 also includes a block 62 fastened to and extending downwardly from the distal end of the arm 61, and the outer cup lid 51 is fixed to the block 62. More specifically, a flange 63 extends outwardly from the lower end of the block 62, and a flange 53 projects inwardly from the upper end of the outer cup lid 51 in vertically spaced and overhanging relation to the flange 63. Pins 54 that are vertically slidably inserted through the flange 63 have upper and lower ends fixed respectively to the flange 53 and the upper surface of the outer cup lid 51. Therefore, the block 62 is coupled to the outer cup lid 51 through a lost-motion connection. When the block 62 is lifted by the arm 61 from the position in which the outer and inner cups 20, 30 are closed by the lid assembly 50, the block 62 is first elevated a first vertical distance, which is equal to the distance between the lower surface of the flange 53 and the upper surface of the outer cup lid 51, with respect to the outer cup lid 51, and then engages the flange 53 and lifts the outer cup lid 51.

The inner cup lid 52 includes a central boss 55 projecting upwardly from the upper surface thereof. The boss 55 comprises a smaller-diameter portion 55a joined to the upper surface of the inner cup lid 52 and a larger-diameter portion 55b connected to the upper end of the smaller-diameter portion 55a. The smaller-diameter portion 55a is rotatably supported in a bearing region 56 of the outer cup lid 51 with a slight gap or clearance G1 left therebetween. The larger-diameter portion 55b has a stopper 55c comprising a tapered lower surface, which can engage a tapered upper surface 56a of the bearing region 56 to prevent the boss 55 from being removed from the bearing region 56, i.e., to prevent the inner cup lid 52 from being detached from the outer cup lid 51. When the outer cup lid 51 is lifted by the block 62, as described above, the bearing region 56 and hence the outer cup lid 51 can move a second vertical distance with respect to the boss 55 until the tapered upper surface 56a engages the stopper 55c.

The boss 55 has an upwardly open recess 70 defined therein and a through hole 71 defined in the bottom thereof at the center of the inner cup lid 52, the through hole 71 communicating with the recess 70. The through hole 71 includes an upper female conical portion 71a opening upwardly in communication with the recess 70.

The block 62 has a central boss 72 projecting downwardly into the recess 70 with a gap or clearance G2 left between the boss 72 and the circumferential surface of the recess 70. The boss 72 has a cleaning solution supply passage 73 defined vertically axially therethrough and having an upper end connected to a tube 74 extending from a cleaning solution source (not shown).

The block 62, the bearing region 56, and the boss 55 define therebetween an inner space or cavity S that communicates with ambient air outside of the block 62 and the lid assembly 50.

Figure 4:
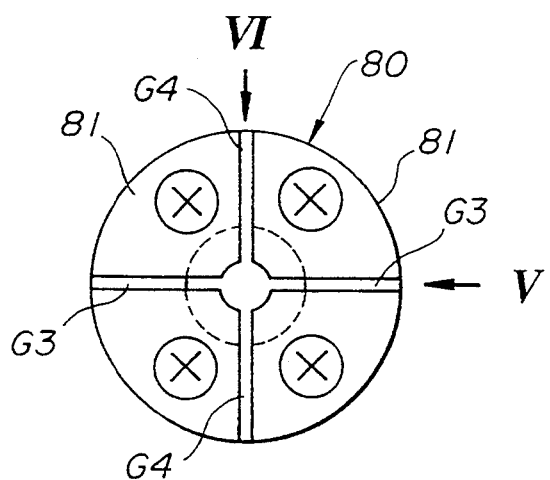
FIG. 4 is a bottom view of a valve body holder in the solution applying apparatus shown in FIG. 1.
Figure 5:
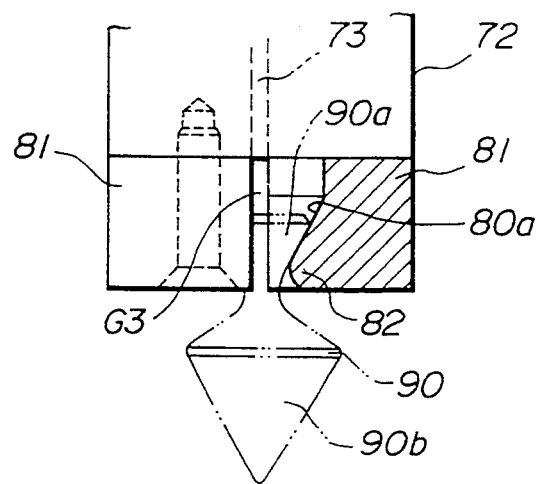
FIG. 5 is a schematic side elevational view of the valve body holder as viewed in the direction indicated by the arrow V in FIG. 4.
Figure 6:
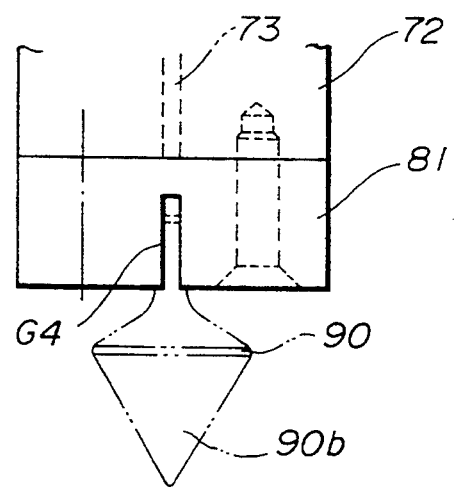
FIG. 6 is a schematic side elevational view of the valve body holder as viewed in the direction indicated by the arrow VI in FIG. 4.

A cylindrical holder 80 is secured to the lower surface of the boss 72, and a valve body 90 is rockably supported by and extends downwardly from the holder 80. As shown in FIGS. 4 through 6, the holder 80 comprises a pair of spaced semicylindrical members 81 which jointly define a bore 80a therebetween that accommodates therein a neck 90a of the valve body 90. The semicylindrical members 81 have respective throat members 82 projecting from lower portions thereof toward each other and engaging the neck 90a of the valve body 90. The semicylindrical members 81 fixed to the lower surface of the boss 72 are spaced from each other by a gap or clearance G3. Each of the semicylindrical members 81 has a gap or clearance G4 defined therein across its widest region. The cleaning solution supply passage 73 communicates with a space below the holder 80 at all times through these gaps G3, G4.

The valve body 90 has a lower male conical portion 90b extending downwardly from the neck 90a thereof. The male conical portion 90b has a conical taper surface complementary to the conical taper surface of the female conical portion 71a.

When the arm 61 is lowered from its uppermost position, the valve body 90 enters the hole 71 and is self-centered in the hole 71 because the male conical portion 90b is complementarily fitted in the female conical portion 71a. When the conical taper surfaces of the male and female conical portions 90b, 71a are finally brought into intimate contact with each other, the through hole 71 is hermetically closed reliably by the valve body 90.

As shown in FIG. 3, a flow-rectifying plate 91 is attached to the lower surface of the inner cup lid 52 with a gap or clearance G5 defined therebetween for supplying a cleaning solution therethrough. The gap G5 communicates at its center with the through hole 71 in the boss 55 and has an outer circumferential edge opening at an inner circumferential surface of the inner cup 30 that is closed by the inner cup lid 52.

A coating solution such as a resist solution is applied to the upper surface of a workpiece W such as a glass substrate as follows: The outer cup 20 and the inner cup 30 are opened upwardly, and the chuck 40 is lifted to raise its upper surface upwardly of the inner cup 30. Then, the workpiece W is placed on the chuck 40, and a vacuum is developed in the suction groove 43 to attract the workpiece W against the chuck 40. At this time, the outer cup lid 51 and the inner cup lid 52 have been displaced out of a position above the outer cup 20 and the inner cup 30.

Thereafter, the chuck 40 is lowered until its upper surface lies flush with the upper surface of the inner cup 30. The coating solution is then dropped onto the upper surface of the workpiece W fixed to the chuck 40 from the nozzle mounted on the distal end of the arm 60. After the coating solution has been dropped, the arm 60 is retracted to move away the nozzle, and the arm 61 is angularly moved to bring the lid assembly 50 to the position above the outer cup 20 and the inner cup 30.

Then, the arm 61 descends to cause the inner cup lid 52 to close the upper opening of the inner cup 30 and thereafter to cause the outer cup lid 51 to close the upper opening of the outer cup 20, as shown in FIGS. 1 and 3. The chuck 40 and the inner cup 30 which engages the chuck 40 through the clutch are then rotated at high speed by the motor through the shaft 41. The coating solution on the workpiece W is spread radially outwardly and coated uniformly on the upper surface of the workpiece W under centrifugal forces that are developed by the rotation of the chuck 40 and the inner cup 30.

Figure 7:
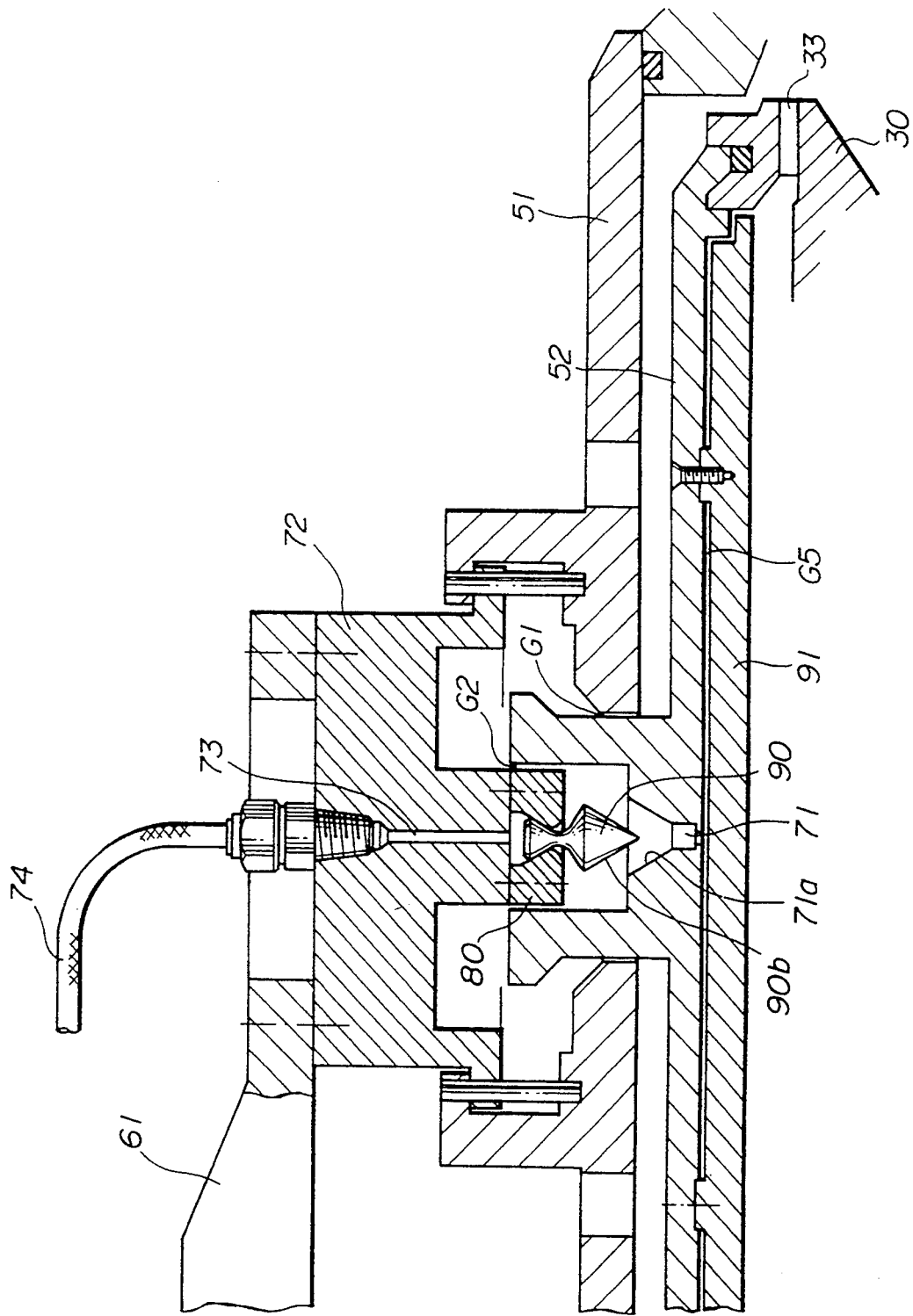
FIG. 7 is an enlarged fragmentary cross-sectional view of the solution applying apparatus shown in FIG. 1, with the lid closed and a valve body open.

While the coating solution is being coated on the workpiece W upon rotation thereof, air in the inner cup 30 is discharged through the communication holes 33 into the collection passage 23, thus evacuating, i.e., developing a vacuum in, the inner cup 30. At this time, any excessive coating solution is also discharged through the communication holes 33 into the collection passage 23. If the lid assembly 50 were opened immediately after the coating solution has been applied to the workpiece W, dust particles and other foreign matter would tend to enter the inner cup 30 due to the vacuum that has been developed in the inner cup 30. To eliminate such a drawback, as shown in FIG. 7, while the lid assembly 50 remains closed on the outer and inner cups 20, 30, the arm 61 is slightly elevated to lift the valve body 90 out of the hole 71 during which time the flange 63 of the block 62 moves upwardly the first vertical distance on and along the pins 54. At the same time, ambient air is introduced into the inner cup 30 through the gaps G1, G2, the through hole 71, and the gap G5, thus smoothly eliminating the vacuum, i.e., increasing the pressure, in the inner cup 30. Thereafter, the lid assembly 50 is lifted to open the outer and inner cups 20, 30. Specifically, the block 62 is moved upwardly the first vertical distance by the arm 61. When the flange 63 engages the flange 53, the outer cup lid 51 starts being lifted to open the outer cup 20. Continued ascent of the block 62 elevates the outer cup lid 51 the second vertical distance until the stopper 55c is engaged by the tapered surface 56a. When the stopper 55c is engaged by the tapered surface 56a, the inner cup lid 52 is lifted by the block 62, thus opening the inner cup 30.

During the coating of the workpiece W, the valve body 90 may be lifted out of the hole 71 as shown in FIG. 7 to communicate the inner cup 30 with the exterior space through the gaps G1, G2, the through hole 71, and the gap G5, thus preventing pressure pulsations which would otherwise be caused by a backflow of air from the collection passage 23 through the communication holes 33 into the inner cup 30.

When the coating solution is thus applied successively to a given number of workpieces W, any excessive coating solution is discharged through the communication holes 33 into the collection passage 23 as described above. At this time, some of the excessive coating solution is attached to the inner circumferential surface of the inner cup 30. If the attached coating solution remained unremoved, it would be dried and solidified, and then scattered and deposited on the workpieces W. To remove any excessive coating solution from the inner circumferential surface of the inner cup 30, the inner circumferential surface of the inner cup 30 is cleaned by a second cleaning means that is provided in addition to the cleaning means 24.

The inner circumferential surface of the inner cup 30 is cleaned while the outer cup 20 and the inner cup 30 are being closed by the respective lids 51, 52 with the workpiece W removed. More specifically, as shown in FIG. 7, the block 62 is lifted within the first vertical distance by the arm 61 to lift the valve body 90 out of the hole 71, and the inner cup 30 is rotated. A cleaning solution is now supplied from the tube 74 into the gap G5 between the inner cup lid 52 and the flow-rectifying plate 91. At this time, the cleaning solution in the cleaning solution supply passage 73 flows through the bore 80a and the gaps G3, G4 along the outer circumferential surface of the valve body 90 into the hole 71. Then, the cleaning solution flows from the hole 71 radially into the gap G5 under centrifugal forces, washing away any coating solution that has been attached to the inner circumferential surface of the inner cup 30. The cleaning solution and the coating solution are discharged through the communication holes 33 into the collection passage 23.

Figure 9:
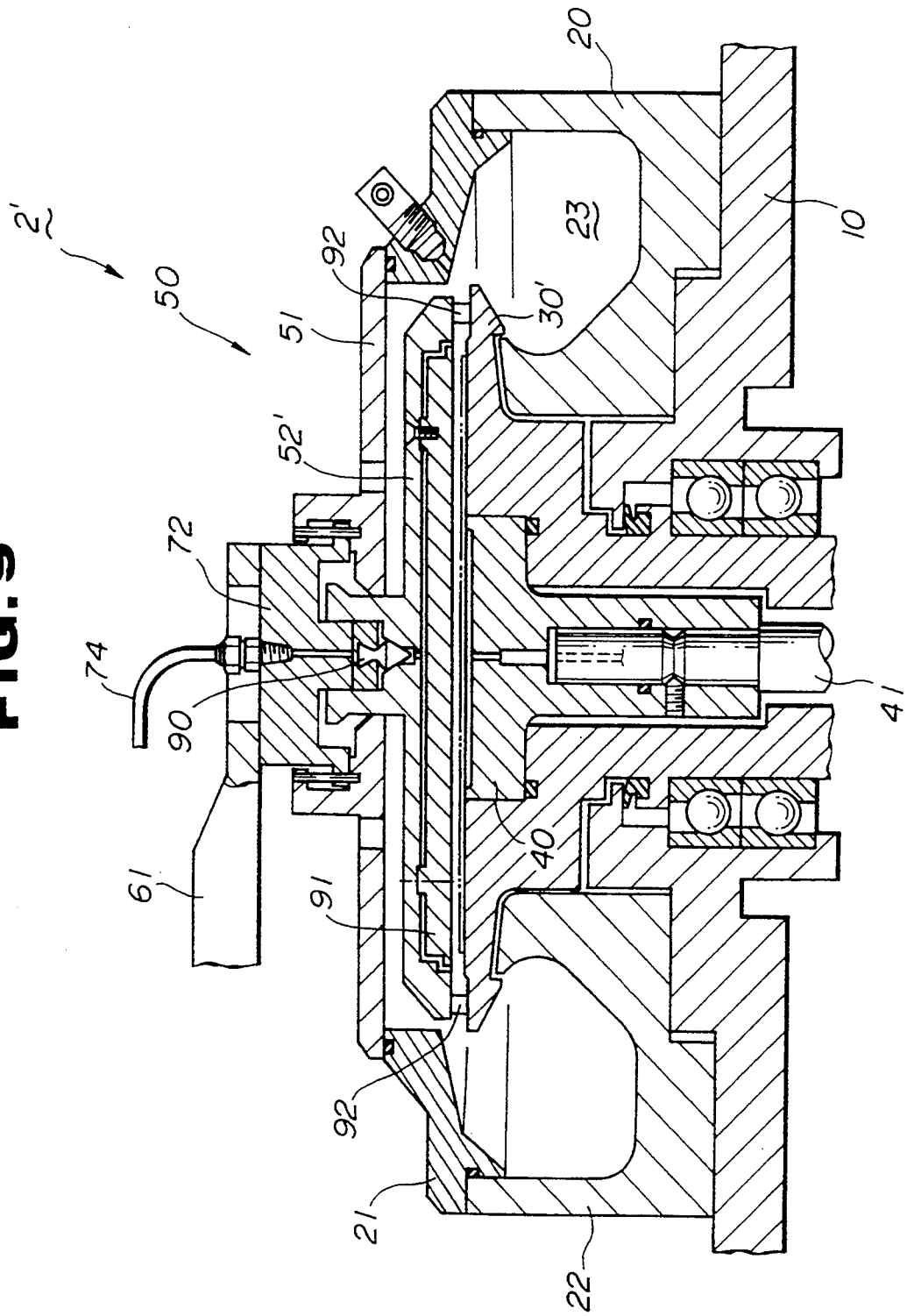
FIG. 9 is a vertical cross-sectional view of a modification of the solution applying apparatus shown in FIG. 1.

FIG. 9 shows a modification of the solution applying apparatus according to the first embodiment of the present invention. The modified solution applying apparatus, generally designated by the reference numeral 2', has a lid assembly 50 that is shown as closed in FIG. 9. In the first embodiment, the inner cup 30 closed by the lid assembly 50 is evacuated by discharging air from the inner cup 30 through the communication holes 33 into the collection passage 23, and any excessive coating solution is discharged from the inner cup 30 through the communication holes 33 into the collection passage 23. In the modified solution applying apparatus 2', an inner cup 30' for holding the workpiece W thereon has no upstanding circumferential wall on its upper circumferential surface, but has a substantially flat upper circumferential surface including a plurality of upwardly projecting positioning teeth 92 at spaced intervals therealong. An inner cup lid 52' for closing the inner cup 30' is placed on and positioned by the positioning teeth 92 when the inner cup lid 52' closes the inner cup 30'. The positioning teeth 92 define a plurality of passageways therebetween which serve as a draining means for draining any excessive coating solution from the inner cup 30' into the collection passage 23. Thus, the space defined between the inner cup lid 52' and the inner cup 30' is open radially outwardly through those passageways between the positioning teeth 92 for suppressing pressure pulsations produced when the inner cup 30' is evacuated.

According to the first embodiment, as described above, the vacuum developed in the inner cup 30 is eliminated through the hole 71 defined in the inner cup lid 52, and the lower portion 90b of the valve body 90 for opening and closing the hole 71 comprises a male conical portion whereas the portion of the hole 71 for mating with the male conical portion 90b comprises a female conical portion 71a. Therefore, the hole 71 can securely closed by the valve body 90 which is self-centered in the hole 71 when the valve body 90 simply falls into the hole 71.

Therefore, no pressure leaks through the valve body 90 and the hole 71 while the coating solution is being applied to the workpiece W. As any seal such as a packing is not employed between the valve body 90 and the hole 71, it is not necessary to take into account any dust particles which would otherwise be produced from a seal.

The bearing region 56 by which the inner cup lid 52 is rotatably supported also doubles as a region for allowing the inner cup lid 52 to move vertically with respect to the outer cup lid 51. Consequently, the inner and outer cup lids 52, 51 are mechanically simple. The gap G2 is present between the boss 55 of the inner cup lid 52 and the bearing region 56 of the outer cup lid 51 to keep them out of contact for thereby preventing vibrations produced when the inner cup 30 is rotated from being transmitted to the outer cup 20.

A solution applying apparatus 200 (see FIG. 10) having a rotatable cup according to a second embodiment of the present invention will be described below.

In the first embodiment, the inner cup 30 has the communication holes (drain holes) 33 defined in the outer circumferential wall thereof. While any excessive coating solution is discharged through the drain holes 33 into the collection passage 23 in the outer cup 20, a cleaning solution or a solvent is ejected from the cleaning means 24 toward the outer open ends of the drain holes 33 for preventing the coating solution from being dried into small solid fragments and hence preventing those solid fragments from being attached to the workpiece W in the inner cup 30.

The solution applying apparatus 200 is arranged for more effectively removing the excessive coating solution that is discharged from the inner cup.

Figure 10:
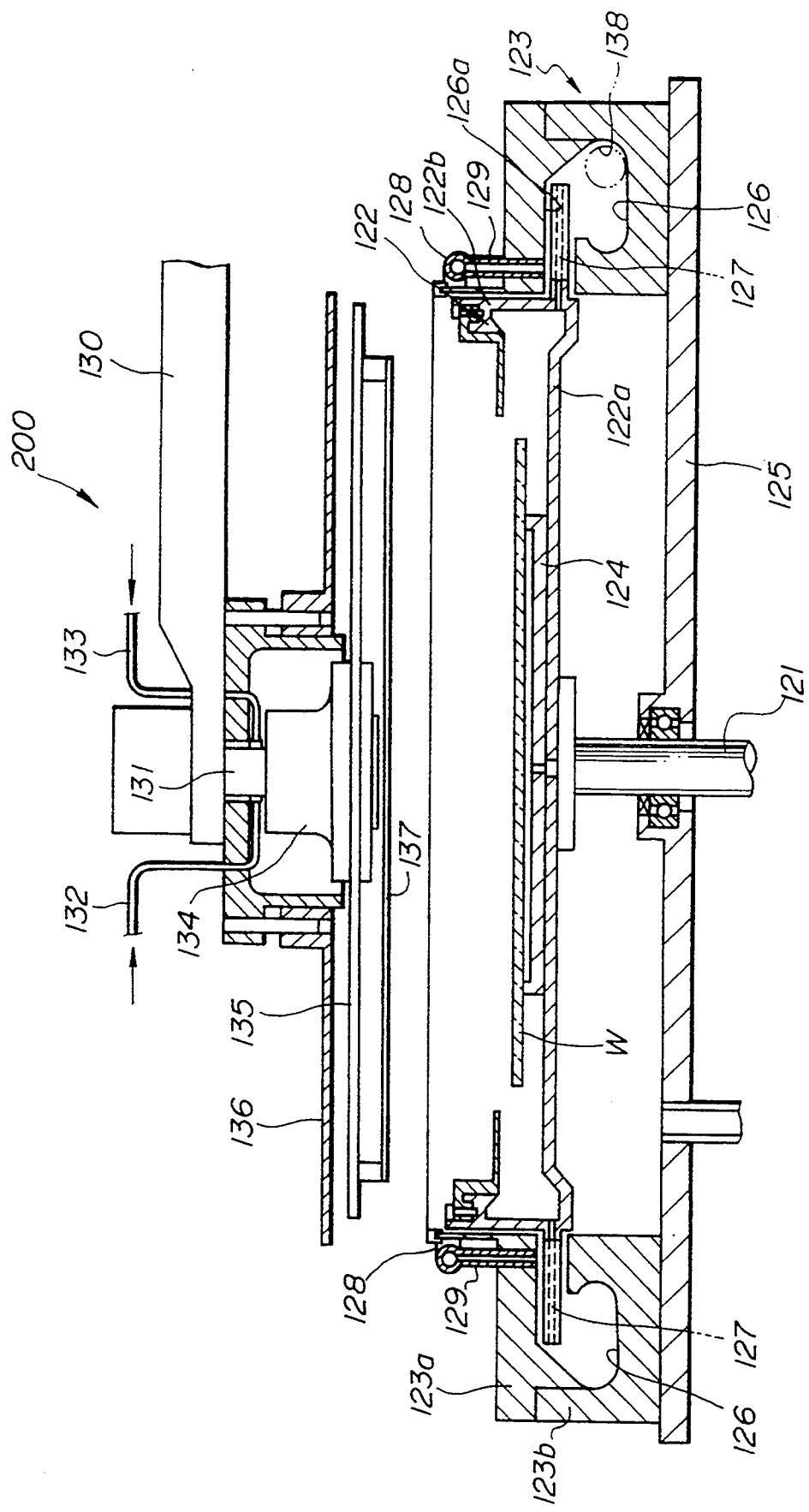
FIG. 10 is a vertical cross-sectional view of a solution applying apparatus having a rotatable cup according to a second embodiment of the present invention, with a lid open over the rotatable cup.
Figure 11:
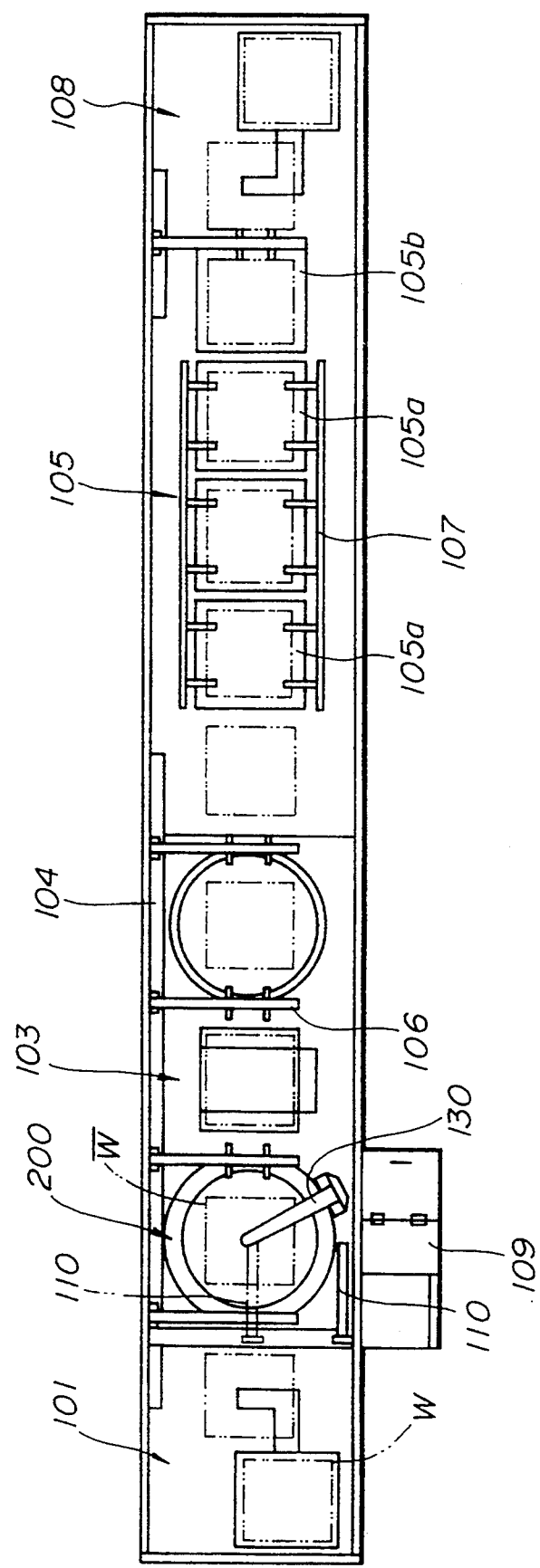
FIG. 11 is a plan view of a film forming process line which incorporates the solution applying apparatus shown in FIG. 10.

FIG. 11 shows a film forming process line which incorporates the solution applying apparatus 200 shown in FIG. 10.

As shown in FIG. 11, the film forming process line includes a charging station 101 at its upstream end (left-hand end) for supplying a rectangular plate-like workpiece W such as a glass substrate, the solution applying apparatus 200 positioned downstream of the charging station 101, an evacuating and drying device 103 positioned downstream of the solution applying apparatus 200, a cleaning device 104 positioned downstream of the evacuating and drying device 103 for cleaning the reverse side, i.e., the lower surface, of the workpiece W, and a heating station 105 positioned downstream of the cleaning device 104 and having a succession of hot plates 105a and a cooling plate 105b. The workpiece W is fed from the charging station 101 successively through the solution applying apparatus 200, the evacuating and drying device 103, and the cleaning device 104 to the heating station 105 by a feeding device 106 while the lower surfaces of front and rear ends of the workpiece W are being supported by the feeding device 106. In the heating station 105, the workpiece W is transferred successively over the hot plates 105a while the lower surface of the workpiece W is being supported by a feeding device 107 which makes cranking movement in a vertical plane, and is finally fed over the cooling plate 105b which adjusts the temperature of the workpiece W.

A replaceable coating solution supplying apparatus 109 is disposed in front of the solution applying apparatus 200. A coating solution supplied from the coating solution supplying apparatus 109 is sent to a nozzle mounted on a movable arm 110, and dropped from the nozzle onto the upper surface of the workpiece W in the solution applying apparatus 200.

As shown in FIG. 10, the solution applying apparatus 200 has an inner cup 122 mounted on the upper end of a rotatable shaft 121 of a spinner and an outer cup 123 disposed around the inner cup 122. The inner cup 122 comprises a bottom wall 122a and an outer circumferential wall 122b extending upwardly from the outer circumferential edge of the bottom wall 122a. A vacuum chuck 124 is mounted on the bottom wall 122a.

The outer cup 123 is fixedly mounted on a support plate 125 through which the shaft 121 extends vertically. The outer cup 123 comprises an upper member 123a and a lower member 123b fixed to the support plate 125, the upper member 123a being supported on the lower member 123b. The upper and lower members 123a, 123b jointly define an annular collection passage 126 therebetween. A plurality of drain ducts 127 project radially outwardly from the outer circumferential wall 122b of the inner cup 122 and have respective drain holes defined therein which serve as a draining means for draining any excessive coating solution out of the inner cup 122. The drain ducts 127 extend into the collection passage 126 through a constricted region 126a thereof.

Figure 12:
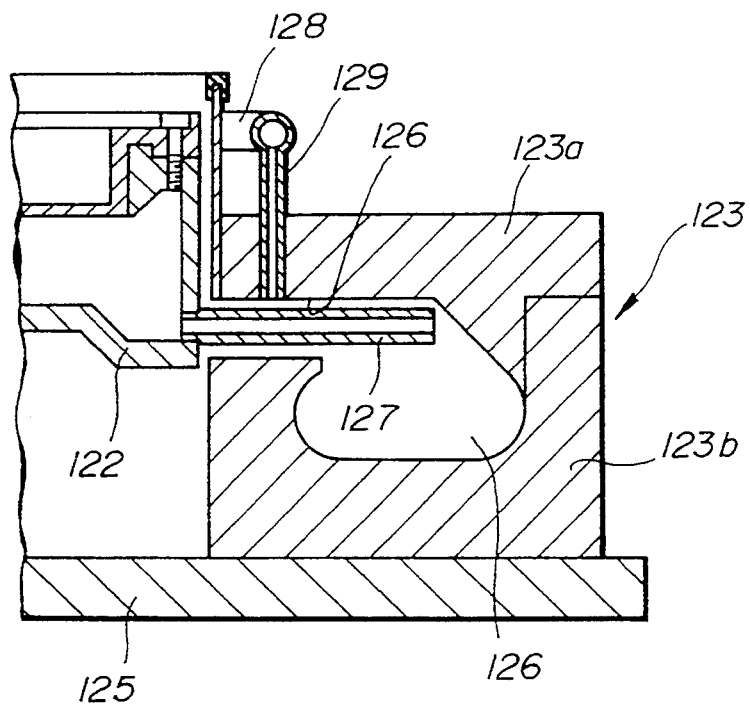
FIG. 12 is an enlarged fragmentary cross-sectional view of the solution applying apparatus shown in FIG. 10.

An annular pipe 128 for supplying a solvent is disposed above the outer cup 123, and a plurality of solvent supply pipes 129 (see also FIG. 12) are branched downwardly from the annular pipe 128. The solvent supply pipes 129, serving as a cleaning means, are inserted into the outer cup 123 and have lower ends opening at the upper surface of the constricted region 126a near the drain ducts 127.

The arm 110 shown in FIG. 11 and another arm 130 are disposed upwardly of the inner cup 122 and the outer cup 123. The arm 130 can move angularly, vertically, or both angularly and vertically out of interference with the arm 110. A shaft 131 extends downwardly from the distal end of the arm 130 and has a nozzle hole defined therein which is connected through hoses 132, 133 to a source of a nitrogen gas and a source of a cleaning solution or a solvent.

A boss 134 is rotatably mounted on the shaft 131 and supports an inner cup lid 135 for closing the upper opening of the inner cup 122. The arm 130 which is positioned above the inner cup lid 135 supports on the lower surface of its distal end an outer cup lid 136 for closing the upper opening of the outer cup 123. A flow-rectifying plate 137 for preventing turbulent flows in the inner cup 122 is attached to the lower surface of the inner cup lid 135.

Figure 13:
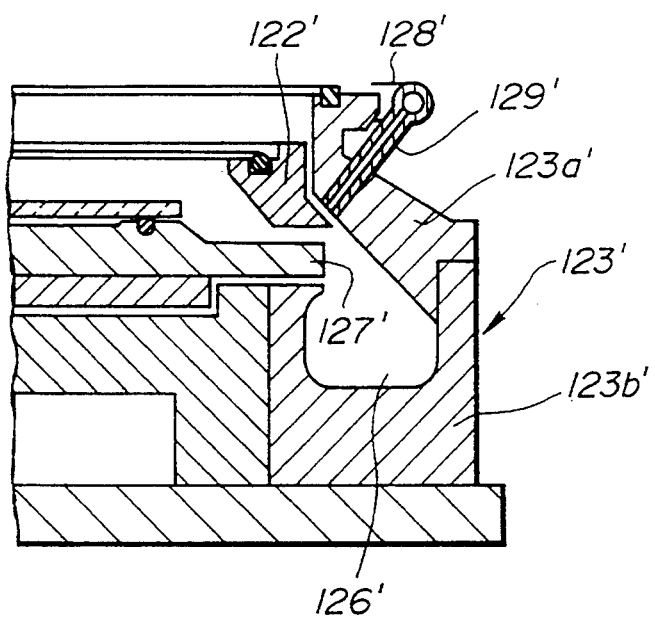
FIG. 13 is a vertical cross-sectional view of a modification of the solution applying apparatus shown in FIG. 10.

FIG. 13 shows a modification of the solution applying apparatus shown in FIG. 10, the modification having a differently shaped collection passage 126'.

As shown in FIG. 13, the collection passage 126' has an inclined upper surface, and solvent supply pipes 129' as a cleaning means have ends opening at the inclined upper surface of the collection passage 126'. Additionally, the structures of the inner cup 122', the outer cup 123', 123a', 123b' and the drain ducts 127' are modified in comparison to the apparatus of FIG. 10.

To apply a coating solution such as a resist solution uniformly to the upper surface of a workpiece W such as a glass substrate, the inner cup 122 and the outer cup 123 are opened upwardly, and the coating solution is dropped onto the upper surface of the workpiece W held by the vacuum chuck 124 from the nozzle on the arm 110. Thereafter, the arm 110 is retracted, and the arm 130 is angularly moved to place the inner and outer cup lids 135, 136 on the inner cup 122 and the outer cup 123, respectively, as shown in FIG. 10.

The arm 130 is then lowered to close the inner cup 122 with the inner cup lid 135 and also to close the outer cup 123 with the outer cup lid 136. The vacuum chuck 124 and the inner cup 122 are rotated in unison with each other by the spinner for causing the coating solution on the workpiece W to spread and be coated uniformly on the surface of the workpiece W.

Any excessive coating solution, other than the coating solution that has been applied to the workpiece W, is discharged under centrifugal forces through the drain ducts 127 into the collection passage 126. Since an air stream has been developed in one direction in the collection passage 126 by the rotation of the drain ducts 127, almost all coating solution that has entered the collection passage 126 flows along the collection passage 126, and is discharged therefrom through a discharge pipe 138.

At the same time, a solvent is dropped from the solvent supply pipes 129 into the collection passage 126. The dropped solvent is broken up into a mist of small solvent droplets by either colliding with the rotating drain ducts 127 and/or being hit by the air flow produced by the rotating drain ducts 127. The mist of solvent is filled in the collection passage 126. Therefore, the collection passage 126 is saturated with the mist of solvent which prevents the excessive coating solution scattered from the drain ducts from being attached to and solidified on the inner wall surface of the collection passage 126.

In the solution applying apparatus according to the second embodiment, as described above, the solvent supply pipes 129 are open into the collection passage 126 which accommodates the drain ducts 127 projecting from the inner cup 122, for saturating the collection passage 126 with a mist of solvent to prevent the excessive coating solution from being attached to and solidified on the inner wall surface of the collection passage 126. The collection passage 126 can easily be saturated with a mist of solvent because the plural solvent supply pipes 129 are open into the collection passage 126 in the vicinity of the drain ducts 127.

The drain ducts 127 projecting into the collection passage 126 and the solvent supply pipes 129 opening into the collection passage 126 near the drain ducts 127 may be incorporated in the solution applying apparatus 2 according to the first embodiment. Conversely, the lid assembly 50 of the solution applying apparatus 2 according to the first embodiment may be incorporated in the solution applying apparatus 200 according to the second embodiment.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

What is claimed is:

1. A solution applying apparatus comprising:
   an outer cup having an upper opening;
   a rotatable inner cup disposed in said outer cup and having an upper opening, for housing a planar workpiece therein which is to be coated with a coating solution;
   a lid assembly having an outer cup lid for closing the upper opening of said outer cup and an inner cup lid for closing the upper opening of said inner cup, said inner cup lid being rotatable with respect to said outer cup lid;
   said inner and outer cup lids having respective engagement surfaces selectively engageable together such that said inner and outer cup lids are movable together in a vertical direction; and
   said inner cup having draining means in an outer circumferential portion thereof for providing communication between a space within said inner cup and a space outside of said inner cup to drain excessive coating solution from said inner cup, said outer cup having an annular collection passage defined therein along the outer circumferential portion of said inner cup, said draining means being exposed to said annular collection passage.

2. A solution applying apparatus according to claim 1, wherein said inner cup has a plurality of upwardly projecting positioning teeth spaced at intervals along said outer circumferential portion thereof, said apparatus further including lifting/lowering means for moving said inner and outer cup lids together in said vertical direction, said inner cup lid being positionable on said positioning teeth by said lifting/lowering means, and said draining means comprising a plurality of passageways defined between said positioning teeth.

3. A solution applying apparatus according to claim 1, wherein said draining means comprises a drain duct projecting radially outwardly from the outer circumferential portion of said inner cup into said annular collection passage and having a drain hole which provides communication between said inner cup and said annular collection passage.

4. A solution applying apparatus according to claim 3, wherein said draining means comprises a plurality of drain ducts spaced uniformly about the outer circumferential portion of said inner cup, and said apparatus further includes means for discharging a cleaning solution toward said drain ducts outwardly of said inner cup.

5. A solution applying apparatus according to claim 1, including cleaning means for ejecting a cleaning solution toward said draining means outwardly of said inner cup, said cleaning means being supported on said outer cup.

6. A solution applying apparatus according to claim 5, wherein said cleaning means comprises a solvent supply pipe for supplying a solvent of the coating solution discharged from said draining means.

7. A solution applying apparatus according to claim 6, wherein said solvent supply pipe has an open end positioned near said drain duct such that the solvent supplied from said solvent supply pipe will be broken up into a mist of solvent in said annular collection passage upon rotation of said drain duct in unison with said inner cup.

8. A thin film coating apparatus according to claim 1, including means for moving said lid assembly in said vertical direction, said outer cup lid having an opening defined in a central portion thereof, said inner cup lid having a boss provided on a central portion thereof and extending through said opening in said outer cup lid, said boss having a first portion with a cross-sectional shape slightly smaller than the opening in the outer cup lid and a second portion with a cross-sectional shape larger than said opening in said outer cup lid, said respective engagement surfaces are provided on a central portion of said outer cup lid and a second portion of said boss.

9. A thin film coating apparatus according to claim 8, further including means for fluid communication between a space within said inner cup and an external source while said inner and outer cup lids cover said inner and outer cups, respectively, said fluid communication means including an opening defined through said inner cup lid and a conical valve body member selectively positionable in said opening defined in the inner cup lid.

10. A solution applying apparatus according to claim 9, including a block for rockably supporting said conical valve body member and operatively connected to said inner and outer cup lids such that the conical valve body member is unseated from the opening in the inner cup lid when the block is moved vertically said first distance, the outer cup lid is lifted from the outer cup when the block is moved further vertically said second distance, and the inner cup lid is lifted from the inner cup when the block is further moved upwardly vertically beyond said second distance.

11. A solution coating apparatus according to claim 1, wherein a gap is defined between said inner and outer cup lids when said inner and outer cup lids close said inner and outer cups, respectively, such that vibrations in the inner cup lid as it is rotated are not transmitted to the outer cup lid.

12. A solution applying apparatus comprising:
an outer cup having an upper opening;
a rotatable inner cup disposed in said outer cup and having an upper opening, for housing a planar workpiece therein which is to be coated with a coating solution;
a lid assembly having an outer cup lid for closing the upper opening of said outer cup and an inner cup lid for closing the upper opening of said inner cup, said inner cup lid being rotatable with respect to said outer cup lid;
said inner cup having draining means in an outer circumferential portion thereof for providing communication between a space within said inner cup and a space outside of said inner cup to drain excessive coating solution from said inner cup, said outer cup having an annular collection passage defined therein along the outer circumferential portion of said inner cup, said draining means being exposed to said annular collection passage;
said lid assembly further comprising a block operatively connected to said inner and outer cup lids, said block being movable upwardly a first distance from a first position in which said outer cup and said inner cup are closed by said lid assembly, into a second position in engagement with said outer cup lid;
lifting/lowering means for moving said block vertically;
said inner cup lid having a boss projecting upwardly from a central portion thereof and having a female conical hole defined therein;
said outer cup lid having a bearing region slidably and rotatably fittable over said boss with a first gap defined therebetween, said bearing region being engageable with said boss upon upward movement of said block by a second distance into a third position;
said block having a valve body extending downwardly therefrom and rockably supported thereon, said valve body having a male conical portion sealingly fittable in said female conical hole; and
said lifting/lowering means moves said block independently of said inner and outer cup lids when said block is moved said first distance, and said lifting/lowering means moves said outer cup lid together with said block and independently of said inner cup lid when said block is moved said second distance.

13. A solution applying apparatus according to claim 12, wherein said outer cup is held substantially out of contact with said inner cup lid when said outer cup lid is lowered into a position in which said outer cup lid closes the upper opening of said outer cup.

14. A solution applying apparatus according to claim 12, wherein said inner cup lid has a flow-rectifying plate attached to a lower surface thereof with a second gap defined therebetween, said second gap communicating with said female conical hole defined in said boss and opening into said inner cup.

15. A solution applying apparatus according to claim 14, wherein said block has a cleaning solution supply passage defined therein for connection to a cleaning solution source, said cleaning solution supply passage being connectable to said female conical hole through said valve body when said male conical portion of the valve body is lifted out of said female conical hole;
the arrangement being such that after the planar workpiece has been coated with the solution, said block is moved upwardly within said first distance while said outer and inner cups remain closed by said outer and inner cup lids, respectively, to lift said male conical portion out of said female conical hole for thereby allowing a cleaning solution to be introduced into said inner cup through said cleaning solution supply passage, said female conical hole, and said second gap.

16. A solution applying apparatus according to claim 15, wherein said boss has an upwardly open recess defined therein, said female conical hole being positioned in a bottom of said recess, said block having a downwardly projecting boss fittable in said recess with a third gap defined therebetween, said cleaning solution supply passage extending through said downwardly projecting boss, said downwardly projecting boss having holder means for holding said valve body rockably thereon and allowing the cleaning solution to flow from said cleaning solution supply passage along an outer surface of said valve body out of said holder means.

17. A solution applying apparatus comprising:
an outer cup having an upper opening;
a rotatable inner cup disposed in said outer cup and having an upper opening, for housing a planar workpiece therein which is to be coated with a coating solution;
a lid assembly having an outer cup lid for closing the upper opening of said outer cup and an inner cup lid for closing the upper opening of said inner cup, said inner cup lid being rotatable with respect to said outer cup lid;
said inner cup having draining means in an outer circumferential portion thereof for providing communication between a space within said inner cup and a space outside of said inner cup to drain excessive coating solution from said inner cup, said outer cup having an annular collection passage defined therein along the outer circumferential portion of said inner cup, said draining means being exposed to said annular collection passage;
said lid assembly further comprising vent means for allowing ambient air to smoothly enter said inner cup after a solution applying operation;
said apparatus further comprising lifting/lowering means for moving said lid assembly vertically; and
said lifting/lowering means being adapted to open said venting means while said outer and inner cups are closed by said outer and inner cup lids, respectively.

18. A solution applying apparatus according to claim 17, wherein said venting means comprises a female conical hole defined in a boss projecting upwardly from a central portion of said inner cup lid and a male conical valve body sealingly fittable in said female conical hole and rockably supported by said lifting and lowering means such that said valve body is self centering in relation to said female conical hole.

19. A solution applying apparatus according to claim 17, wherein said lifting and lowering means is further adapted to raise said outer cup lid out of engagement with said outer cup while said inner cup lid remains in closing engagement with said inner cup.

20. A solution applying apparatus according to claim 17, further including means for supplying a cleaning solution within said inner cup near said draining means while said inner and outer cups are closed by said inner and outer cup lids, respectively, said cleaning solution supply means having a flow path which includes said female conical hole.

21. A solution applying apparatus according to claim 20, further including cleaning means for ejecting a cleaning solution within said outer cup toward said draining means, said cleaning means being supported on said outer cup.

22. A thin film coating apparatus comprising:
an outer cup having an upper opening;
a rotatable inner cup disposed in said outer cup and having an upper opening, for housing a planar workpiece therein which is to be coated with a coating solution;
a rotatable chuck positionable within said inner cup and rotatable together therewith, said rotatable chuck securely supports the planar workpiece on an upper surface thereof;
a lid assembly having an outer cup lid for closing the upper opening of said outer cup and an inner cup lid for closing the upper opening of said inner cup, said inner cup lid being rotatable with respect to said outer cup lid;
lifting/lowering means for moving said inner and outer cup lids together toward and away from said inner and outer cups; and
said inner cup having draining means in an outer circumferential portion thereof for providing communication between a space within said inner cup and a space outside of said inner cup to drain excessive coating solution from said inner cup, said outer cup having an annular collection passage defined therein along the outer circumferential portion of said inner cup, said draining means being exposed to said annular collection passage.

23. A thin film coating apparatus according to claim 22, further including means for supplying a cleaning solution into said inner cup through said lid assembly and means for venting an interior space of said inner cup while said inner and outer cup lids cover said inner and outer cups, respectively.

* * * * *

UNITED STATES PATENT AND TRADEMARK OFFICE
CERTIFICATE OF CORRECTION

PATENT NO. : 5,439,519
DATED : 08 August 1995
INVENTOR(S) : Hiroyoshi Sago, Hirotsugu Kumazawa, Futoshi Shimai, Shigemi Fujiyama, Hiroki Endo, Hideya Kobari It is certified that error appears in the above-indentified patent and that said Letters Patent is hereby corrected as shown below:

Column 1, line 5, before "Ser." insert --App.--;

line 17, change "Description of the Relevant" to --Description of the Relevant Art--.

Signed and Sealed this

Thirtieth Day of April, 1996

Attest:

BRUCE LEHMAN

*Attesting Officer*    *Commissioner of Patents and Trademarks*